(12) United States Patent
Liao et al.

(10) Patent No.: US 6,717,358 B1
(45) Date of Patent: Apr. 6, 2004

(54) CASCADED ORGANIC ELECTROLUMINESCENT DEVICES WITH IMPROVED VOLTAGE STABILITY

(75) Inventors: Liang-Sheng Liao, Rochester, NY (US); Kevin P. Klubek, Webster, NY (US); Dustin L. Comfort, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/267,252

(22) Filed: Oct. 9, 2002

(51) Int. Cl.[7] .................................................. H01J 1/62
(52) U.S. Cl. ...................... 313/504; 313/503; 313/502; 313/506; 313/509; 257/44; 428/690; 428/917
(58) Field of Search ................. 313/504, 503, 313/502, 506, 509; 257/40; 428/690, 917

(56) References Cited

U.S. PATENT DOCUMENTS

| | | | |
|---|---|---|---|
| 3,172,862 A | 3/1965 | Gurnee et al. | |
| 3,173,050 A | 3/1965 | Gurnee | |
| 3,710,167 A | 1/1973 | Dresner et al. | |
| 4,356,429 A | 10/1982 | Tang | |
| 4,769,292 A | 9/1988 | Tang et al. | |
| 5,126,802 A | * 6/1992 | Yoshikawa et al. | 257/40 |
| 5,703,436 A | 12/1997 | Forrest et al. | |
| 6,274,980 B1 | 8/2001 | Burrows et al. | |
| 6,337,492 B1 | 1/2002 | Jones et al. | |
| 6,447,879 B1 | * 9/2002 | Sakurai et al. | 428/161 |
| 6,525,465 B1 | * 2/2003 | Fujita | 313/504 |
| 6,603,150 B2 | * 8/2003 | Liao et al. | 257/98 |
| 6,614,176 B2 | * 9/2003 | Kim et al. | 313/506 |
| 2003/0075720 A1 | * 4/2003 | Liao et al. | 257/79 |

* cited by examiner

*Primary Examiner*—Ashok Patel
*Assistant Examiner*—Holly Harper
(74) *Attorney, Agent, or Firm*—Raymond L. Owens

(57) ABSTRACT

A cascaded organic electroluminescent device with connecting units having improved voltage stability is disclosed. The device comprises an anode, a cathode, a plurality of organic electroluminescent units disposed between the anode and the cathode, wherein the organic electroluminescent units comprise at least a hole-transporting layer and an electron-transporting layer, and a connecting unit disposed between each adjacent organic electroluminescent unit, wherein the connecting unit comprises, in sequence, an n-type doped organic layer, an interfacial layer, and a p-type doped organic layer, and wherein the interfacial layer prevents diffusion or reaction between the n-type doped organic layer and the p-type doped organic layer.

15 Claims, 2 Drawing Sheets

CASCADED ORGANIC ELECTROLUMINESCENT DEVICES WITH IMPROVED VOLTAGE STABILITY

CROSS-REFERENCE TO RELATED APPLICATION

Reference is made to commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference.

FIELD OF INVENTION

The present invention relates to providing a plurality of organic electroluminescent (EL) units to form a cascaded organic electroluminescent device.

BACKGROUND OF THE INVENTION

While organic electroluminescent devices have been known for over two decades, their performance limitations have represented a barrier to many desirable applications. In simplest form, an organic electroluminescent device is comprised of an anode for hole injection, a cathode for electron injection, and an organic layer sandwiched between these electrodes to support charge recombination that yields emission of light. These devices are also commonly referred to as organic light-emitting diodes, or OLEDs. Representative of earlier OLEDs are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322–334 (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent OLEDs include an organic medium consisting of extremely thin layers (e.g. <1.0 µm) between the anode and the cathode. Herein, the term "organic medium" encompasses the layers between the anode and cathode electrodes. Reducing the thickness lowered the resistance of the organic layer and has enabled devices that operate much lower voltage. In a basic two-layer OLED structure, described first by Tang et al. U.S. Pat. No. 4,356,429, one organic layer of the organic medium adjacent to the anode is specifically chosen to transport holes, therefore, it is referred to as the hole-transporting layer (HTL), and the other organic layer is specifically chosen to transport electrons, referred to as the electron-transporting layer (ETL). Recombination of the injected holes and electrons within the organic medium results in efficient electroluminescence.

There have also been proposed three-layer OLEDs that contain an organic light-emitting layer (LEL) between the HTL and the ETL, such as that disclosed by Tang et al. "Electroluminescence of Doped Organic Thin Films", J. Applied Physics, 65, 3610–3616 (1989). The LEL commonly consists of a host material doped with a guest material. Still further, there has been proposed by Tang et al. in U.S. Pat. No. 4,769,292 a four-layer OLED adding a hole-injecting layer (HIL) between anode and the HTL. These structures have resulted in improved device performance.

Moreover, in order to further improve the performance of the OLEDs, a new kind of OLED structure called stacked OLED, which is fabricated by stacking several individual OLED vertically, has also been proposed. Forrest et al. in U.S. Pat. No. 5,703,436 and Burrows et al. in U.S. Pat. No. 6,274,980 disclosed their stacked OLEDs. In their inventions, the stacked OLEDs are fabricated by vertically stacking several OLEDs, each independently emitting light of a different color or of the same color. Using their stacked OLED structure can make full color emission devices with higher integrated density in the display, but each OLED needs a separate power source. In an alternative design, Jones et al. in U.S. Pat. No. 6,337,492 proposed a stacked OLED structure by vertically stacking several OLED without individually addressing each OLED in the stack. Jones et al. believe that their stacked structure could increase the luminance output and operational lifetime.

The aforementioned stacked OLEDs use individual OLEDs (anode/organic medium/cathode) as building blocks to fabricate the stacked OLEDs. The complex architecture in these designs presents serious fabrication problems. It is difficult to achieve high optical transparency in the visible light range due to the presence of electrodes internal to the stack (intra-electrodes). This reduces the overall device efficiency.

SUMMARY OF THE INVENTION

It is an object of the present invention to make a cascaded OLED with improved overall operational stability.

It is another object of the present invention to make a cascaded OLED with improved voltage stability.

These objects are achieved by a cascaded organic electroluminescent device comprising:

a) an anode;

b) a cathode;

c) a plurality of organic electroluminescent units disposed between the anode and the cathode, wherein the organic electroluminescent units comprise at least a hole-transporting layer and an electron-transporting layer; and d) a connecting unit disposed between each adjacent organic electroluminescent unit, wherein the connecting unit comprises, in sequence, an n-type doped organic layer, an interfacial layer, and a p-type doped organic layer, wherein the interfacial layer prevents diffusion or reaction between the n-type doped organic layer and the p-type doped organic layer.

ADVANTAGEOUS EFFECT OF THE INVENTION

An advantage of the present invention is that it enables a cascaded OLED to function without requiring intra-electrodes, thereby lowering optical losses.

Another advantage of the present invention is that the cascaded OLED has very stable driving voltage during operation.

Another advantage of the present invention is that the cascaded OLED provides significantly improved luminance efficiency as measured in cd/A compared to the conventional non-cascaded OLED device.

Another advantage of the present invention is that the cascaded OLED has an increased brightness if operated under the same current as that of the conventional OLED.

Another advantage is that the cascaded OLED has an increased lifetime if operated under the same brightness as that of the conventional OLED.

Another advantage of the present invention is that the cascaded OLED has a decreased driving voltage and an increased optical output compared to the prior arts of stacked OLEDs.

Another advantage of the present invention is that the cascaded OLED can be operated with a single voltage source with only two electrical bus conductors connecting the device to an external circuit. Thus its device architecture is significantly less complex than those reported in the prior art and is therefore much easier and less costly to fabricate.

Another advantage of the present invention is that the cascaded OLED can have a new way to adjust the emission color of the device by mixing appropriate organic electroluminescent units with different color emissions.

Another advantage of the present invention is that high efficiency white electroluminescence can be produced.

Another advantage of the present invention is that the cascaded OLED can be effectively used in a lamp.

Figure 1:
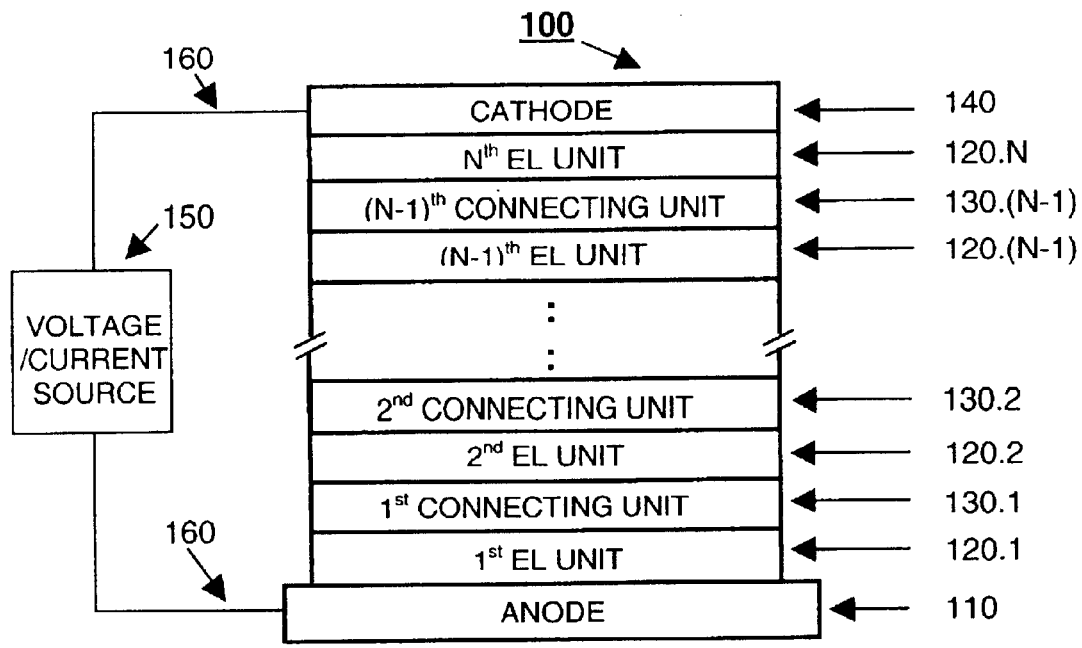
FIG. 1 depicts a schematic cross sectional view of a cascaded OLED in accordance with the present invention, having a plurality of organic EL units and having a connecting unit in between each of the organic EL units.
Figure 2:
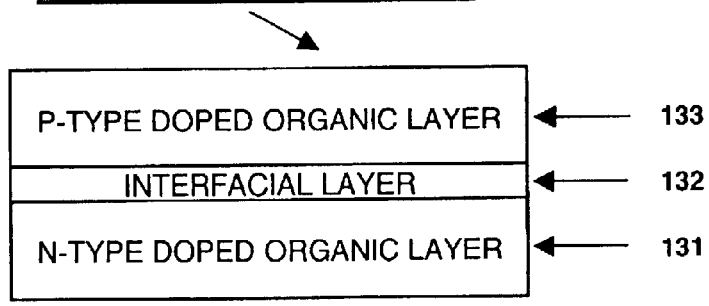
FIG. 2 depicts a schematic cross sectional view of a connecting unit having an n-type doped organic layer, an interfacial layer, and a p-type doped organic layer useful in the cascaded OLED in accordance with the present invention.

It will be understood that FIGS. 1–2 are not to scale since the individual layers are too thin and the thickness differences of various layers too great to permit depiction to scale.

DETAILED DESCRIPTION OF THE INVENTION

In commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference, the layer structure of a cascaded OLED (or stacked OLED) has been disclosed. The device structure comprises an anode, a cathode, a plurality of organic EL units and a plurality of organic connectors (or connecting units thereafter), wherein each of the connecting units is disposed between two organic EL units. The organic EL unit comprises, in sequence, a hole-transport layer, a light-emitting layer, and an electron-transport layer, denoted in brief as HTL/LEL/ETL. The connecting unit comprises, in sequence, an n-type doped organic layer and a p-type doped organic layer. Thus, in this structure, the ETL of the EL unit is adjacent to the n-type doped layer of the connecting unit and the HTL of the EL unit is adjacent to the p-type doped connecting unit. In this cascaded device structure only a single external power source is needed to connect to the anode and the cathode with the positive potential applied to the anode and the negative potential to the cathode. No other electrical connections are needed to connect the individual organic EL units to external electrical power sources.

For a cascaded OLED to function efficiently, it is necessary that the optical transparency of the layers constituting the organic EL units and the connecting units be as high as possible to allow for radiation generated in the organic EL units to exit the device. Furthermore, for the radiation to exit through the anode, the anode should be transparent and the cathode can be opaque, reflecting, or transparent. For the radiation to exit through the cathode, the cathode should be transparent and the anode can be opaque, reflecting or transparent. The layers constituting the organic EL units are generally optically transparent to the radiation generated by the EL units, and therefore their transparency is generally not a concern for the construction for the cascaded OLEDs. Likewise, the layers constituting the connecting units can be constructed from selected organic materials and appropriate n-type or p-type dopants such that their optical transparency can be made as high as possible. Commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference, discloses the art pertaining to the construction of the cascaded OLED with the appropriate connecting units.

Another requirement for the cascaded OLED to function efficiently is that the connecting unit should provide electron injection into the electron-transporting layer and the hole injection into the hole-transporting layer of the two adjacent organic EL units. The construction of such a connecting unit capable of providing excellent electron and hole injection has also been disclosed in commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference. The combination of these device properties, that is, high optical transparency and excellent charge injection, offers the cascade OLED high electroluminescence efficiency and operation at an overall low driving voltage.

The operational stability of cascaded OLED is dependent to a large extent on the stability of the connecting units. In particular, the driving voltage will be highly dependent on whether or not the organic connecting unit can provide the necessary electron and hole injection. It is generally known that the close proximity of two dissimilar materials may result in diffusion of matters from one into another, or in interdiffusion of matters across the boundary between the two. In the case of the cascaded OLED, if such diffusion were to occur in the connecting unit between the n-type doped organic layer and the p-type doped organic layer, the injection properties of this organic connecting unit may degrade correspondingly due to the fact that the individual n-type doped layer or p-type doped layer may no longer be sufficiently electrical conductive. Diffusion or interdiffusion is dependent on temperature as well as other factors such as electrical field induced migration. The latter is plausible in cascaded OLED devices since the operation of OLED generally requires an electric field as high as 10$^6$ volt per centimeter. To prevent such an operationally induced diffusion in the connecting units of a cascaded OLED, a interfacial layer in accordance with the present invention is introduced in between the n-type doped layer and the p-type doped layer, which provides a barrier for interfusion.

FIG. 1 shows a cascaded OLED 100 in accordance with the present invention. This cascaded OLED has an anode 110 and a cathode 140, at least one of which is transparent. Disposed between the anode and the cathode are N organic EL units 120, where N is an integer greater than 1. These organic EL units, cascaded serially to each other and to the anode and the cathode, are designated 120.1 to 120.N where 120.1 is the first EL unit (adjacent to the anode) and 120.N is the $N^{th}$ unit (adjacent to the cathode). The term, EL unit 120, represents any of the EL units named from 120.1 to 120.N in the present invention. When N is greater than 2, there are organic EL units not adjacent to the anode or cathode, and these can be referred to as intermediate organic EL units. Disposed between any two adjacent organic EL units is a connecting unit 130. There are a total of N−1 connecting units associated with N organic EL units and they are designated 130.1 to 130.(N−1). Connecting unit 130.1 is disposed between organic EL units 120.1 and 120.2, connecting unit 130.2 is disposed between organic EL units 120.2 and 120.3, and connecting unit 130.(N−1) is disposed between organic EL units 120.(N−1) and 120.N. The term, connecting unit 130, represents any of the connecting units named from 130.1 to 130.(N−1) in the present invention. The cascaded OLED 100 is externally connected to a voltage/current source 150 through electrical conductors 160.

Cascaded OLED 100 is operated by applying an electric potential generated by a voltage/current source 150 between a pair of contact electrodes, anode 110 and cathode 140, such that anode 110 is at a more positive potential with respect to the cathode 140. This externally applied electrical potential is distributed among the N organic EL units in proportion to the electrical resistance of each of these units. The electric potential across the cascaded OLED causes holes (positively charged carriers) to be injected from anode 110 into the $1^{st}$ organic EL unit 120.1, and electrons (negatively charged carriers) to be injected from cathode 140 into the $N^{th}$ organic EL unit 120.N. Simultaneously, electrons and holes are generated in, and separated from, each of the connecting units (130.1–130.(N−1)). Electrons thus generated in, for example, connecting unit 130.(x−1) ($1<x\leq N$) are injected towards the anode and into the adjacent organic EL unit 120.(x−1). Likewise, holes generated in the connecting unit 130.(x−1) are injected towards the cathode and into the adjacent organic EL unit 120.x. Subsequently, these electrons and holes recombine in their corresponding organic EL units to produce light, which is observed via the transparent electrode or electrodes of the OLED. In other words, the electrons injected from cathode are energetically cascading from the $N^{th}$ organic EL unit to the $1^{st}$ organic EL unit, and emit light in each of the organic EL units. Therefore, we prefer to use the term "cascaded OLED" instead of "stacked OLED" in the present invention.

The same as in commonly assigned U.S. patent application Ser. No. 10/077,270 filed Feb. 15, 2002 by Liang-Sheng L. Liao et al., entitled "Providing an Organic Electroluminescent Device Having Stacked Electroluminescent Units", the disclosure of which is herein incorporated by reference, each organic EL unit 120 in the cascaded OLED 100 is capable of supporting hole and electron-transport, and electron-hole recombination to produce light. Each organic EL unit 120 can comprise a plurality of layers. There are many organic EL multilayer structures known in the art that can be used as the organic EL unit of the present invention. These include HTL/ETL, HTL/LEL/ETL, HIL/HTL/LEL/ETL, HIL/HTL/LEL/ETL/EIL, HIL/HTL/electron-blocking layer or hole-blocking layer/LEL/ETL/EIL, HIL/HTL/LEL/ hole-blocking layer/ETL/EIL. Each organic EL unit in the cascaded OLED can have the same or different layer structures from other organic EL units. The layer structure of the $1^{st}$ organic EL unit adjacent to the anode preferably is of HIL/HTL/LEL/ETL, and the layer structure of the $N^{th}$ organic EL unit adjacent to the anode preferably is of HTL/LEL/ETL/EIL, and the layer structure of the intermediate organic EL units preferably are of HTL/LEL/ETL.

The organic layers in the organic EL unit 120 can be formed from small molecule OLED materials or polymeric LED materials, both known in the art, or combinations thereof. The corresponding organic layer in each organic EL unit in the cascaded OLED device can be the same or different from other corresponding organic layers. Some organic EL units can be polymeric and other units can be of small molecules.

Each organic EL unit can be selected in order to optimize performance or achieve a desired attribute, for example, light transmission through the OLED multilayer structure, driving voltage, luminance efficiency, light emission color, manufacturability, device stability, and so forth.

In order to minimize driving voltage for the cascaded OLED, it is desirable to make each organic EL unit as thin as possible without compromising the electroluminescence efficiency. It is preferable that each organic EL unit is less than 500 nm thick, and more preferable that it be 2–200 nm thick. It is also preferable that each layer within the organic EL unit be 200 nm thick or less, and more preferable that it be 0.1–100 nm.

The number of the organic EL units in the cascaded OLED is, in principle, equal to or more than 2. Preferably, the number of the organic EL units in the cascaded OLED is such that the luminance efficiency in units of cd/A is improved or maximized.

As is known, the conventional OLED comprises an anode, an organic medium, and a cathode. In the present invention, the cascaded OLED comprises an anode, a plurality of organic EL units, a plurality of connecting units, and a cathode, wherein the connecting unit is a new feature in the cascaded OLED.

The connecting units provided between adjacent organic EL units are crucial, as they are needed to provide for efficient electron and hole injection into the adjacent organic EL units. The layer structure of the connecting unit is shown in FIG. 2. It comprises, in sequence, an n-type doped organic layer 131, an interfacial layer 132, and a p-type doped organic layer 133. The n-type doped organic layer 131 is adjacent to the ETL of the organic EL unit towards the anode side, and the p-type doped organic layer 133 is adjacent to the HTL of the organic EL unit towards the cathode side. The n-type doped organic layer is chosen to provide efficient electron injection into the adjacent electron-transporting layer. The p-type doped organic layer is chosen to provide efficient hole-injection into the adjacent hole-transporting layer. The use of an interfacial layer in the connecting unit is to prevent possible interdiffusion or reaction between the n-type doped organic layer and the p-type doped organic layer. To preserve the operational characteristics of the cascaded OLED, this additional interfacial layer should not result in an increase in electrical resistance nor a decrease in the optical transparency, otherwise the driving voltage would increase and the light output would decrease. Therefore, the interfacial layer has at least 90% optical transmission in the visible region of the spectrum. The chemical composition and the thickness of the interfacial layer will influence both the diffusion barrier and optical properties and will therefore need to be optimized. Because the organic layers are particularly sensitive to degradation during deposition, the method of deposition will need to be optimized as well.

An n-type doped organic layer means that the layer is electrically conductive, and the charge carriers are primarily electrons. The conductivity is provided by the formation of charge-transfer complex as a result of electron-transfer from the dopant to the host material. Depending on the concentration and the effectiveness of the dopant in donating an electron to the host material, the layer electrical conductivity can range from semiconducting to conducting. Likewise, a p-type doped organic layer means that the layer is electrically conductive, and the charge carriers are primarily holes. The conductivity is provided by the formation of charge-transfer complex as a result of hole-transfer from the dopant to the host material. Depending on the concentration and the effectiveness of the dopant in donating a hole to the host material, the layer electrical conductivity can range from semiconducting to conducting.

The n-type doped organic layer in each connecting unit comprises a host organic material and at least one n-type dopant. The host material in the n-typed doped organic layer comprises a small molecule material or a polymeric material, or a combination thereof. It is preferred that this host material can support electron-transport. The p-type doped organic layer in each of the connecting unit comprises a host organic material and at least one p-type dopant. The host material comprises a small molecule material or a polymeric material, or a combination thereof. It is preferred that this host material can support hole transport. In general, the host material for the n-type doped layer is different from the host material for the p-type doped layer because of the difference in conduction type. But in some instances, some organic materials can be used as a host in either n-typed or p-type doped organic layer. These materials are capable of supporting the transport of either holes or electrons. Upon doping with an appropriate n-type or p-type dopant, the doped organic layer would then exhibit primarily either electron-transport or hole-transport, respectively. The n-type doped concentration or the p-type doped concentration is preferably in the range of 0.01–20 vol. %. The total thickness of each connecting unit is typically less than 200 nm, and preferably in the range of about 1 to 150 nm.

The electron-transporting materials used in conventional OLED devices represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline) aluminum. Other materials include various butadiene derivatives as disclosed by Tang (U.S. Pat. No. 4,356,429), various heterocyclic optical brighteners as disclosed by Van Slyke et al. (U.S. Pat. No. 4,539,507), triazines, hydroxyquinoline derivatives, and benzazole derivatives. Silole derivatives, such as 2,5-bis(2',2"-bipridin-6-yl)-1,1-dimethyl-3,4-diphenyl silacyclopentadiene reported by Murata et al. (*Applied Physics Letters*, 80, 189 [2002]), are also useful host materials.

The materials used as the n-type dopants in the n-type doped organic layer of the connecting units include metals or metal compounds having a work-function less than 4.0 eV. Particularly useful dopants include alkali metals, alkali metal compounds, alkaline earth metals, and alkaline earth metal compounds. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their inorganic or organic compounds, are particularly useful. The materials used as the n-type dopants in the n-type doped organic layer of the connecting units also include organic reducing agents with strong electron-donating properties. By "strong electron-donating properties" it is meant that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component.

The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoaryl amine, diarylamine, triarylamine, or a polymeric arylamine. Other suitable triarylamines substituted with one or more vinyl radicals and/or comprising at least one active hydrogen-containing group are disclosed by Brantley et al. (U.S. Pat. Nos. 3,567,450 and 3,658,520). A more preferred class of aromatic tertiary amines are those which include at least two aromatic tertiary amine moieties as described by Van Slyke et al. (U.S. Pat. Nos. 4,720,432 and 5,061,569). Non-limiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB).

The materials used as the p-type dopants in the p-type doped organic layer of the connecting units are oxidizing agents with strong electron-withdrawing properties. By "strong electron-withdrawing properties" it is meant that the organic dopant should be able to accept some electronic charge from the host to form a charge-transfer complex with the host. Some non-limiting examples include organic compounds such as 2,3,5,6-tetrafluoro-7,7,8,8-tetracyanoquinodimethane ($F_4$-TCNQ) and other derivatives of TCNQ, and inorganic oxidizing agents such as iodine, $FeCl_3$, $FeF_3$, $SbCl_5$, and some other metal halides. In the case of polymeric hosts, the dopant can be any of the above or also a material molecularly dispersed or copolymerized with the host as a minor component.

Examples of materials that can be used as host for either the n-type or p-type doped organic layers include, but are not limited to: various anthracene derivatives as described in U.S. Pat. No. 5,972,247; certain carbazole derivatives, such as 4,4-bis(9-dicarbazolyl)-biphenyl (CBP); and distyrylarylene derivatives such as 4,4'-bis(2,2'-diphenyl vinyl)-1, 1'-biphenyl and as described in U.S. Pat. No. 5,121,029.

The interfacial layer 132 useful in the connecting unit comprises at least one inorganic semiconducting material or combinations of more than one of the semiconducting materials. Suitable semiconducting materials should have an electron energy band gap less than 4.0 eV. The electron energy band gap is defined as the energy difference between the highest occupied molecular orbital and the lowest unoccupied molecular orbital of the molecule. A useful class of materials can be chosen from the compounds of elements listed in groups IVA, VA, VIA, VIIA, VIIIA, IB, IIB, IIIB, IVB, and VB in the Periodic Table of the Elements (e.g. the Periodic Table of the Elements published by VWR Scientific Products). These compounds include the carbides, silicides, nitrides, phosphides, arsenides, oxides, sulfides, selenides, and tellurides, and mixture thereof. These semiconducting compounds can be in either stoichoimetic or non-stoichiometric states, that is they may contain excess or deficit metal component. Particularly useful materials for the interfacial layer 132 are the semiconducting oxides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, and antimony, or combinations thereof. Particularly useful materials for the interfacial layer 132 also including zinc selenide, gallium nitride, silicon carbide, or combinations thereof.

The interfacial layer 132 useful in the connecting unit also can comprise at least one or more metallic materials, at least one of these metallic materials has a work-function higher than 4.0 eV as listed by Sze, in *Physics of Semiconducting Devices*, $2^{nd}$ Edition, Wiley, N.Y., 1981, p. 251.

The thickness of the interfacial layer 132 suitable for the construction of the connecting units is in the range of 0.05 nm to 10 nm. Preferably, the range is between 0.1 nm to 5 nm for inorganic semiconducting materials and between 0.05 nm to 1 nm for metallic materials.

The interfacial layer 132 suitable for the construction of the connecting units is fabricated by thermal evaporation, electron-beam evaporation, or ion sputtering deposition. Preferably the interfacial layer 132 is fabricated by thermal evaporation which is compatible with the method to deposit organic layers.

The cascaded OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 110, the anode should be transparent or substantially transparent to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work-function higher than 4.0 eV. Desired anode materials are commonly deposited by any suitable means such as evaporation, sputtering, chemical vapor deposition, or electrochemical means. Anodes can be patterned using well known photolithographic processes. Optionally, anodes may be polished prior to application of other layers to reduce surface roughness so as to minimize electrical shorts or enhance reflectivity.

While not always necessary, it is often useful to provide a HIL in the $1^{st}$ organic EL unit to contact the anode 110. The HIL can serve to improve the film formation property of subsequent organic layers and to facilitate injection of holes into the HTL reducing the driving voltage of the cascaded OLED. Suitable materials for use in the HIL include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-ethylphenyl)phenylamino]triphenylamine). A p-type doped organic layer for use in the aforementioned connecting unit is also useful for the HIL as described in U.S. Pat. No. 6,423,429 B2. Alternative hole-injecting materials reportedly useful in organic EL devices are described in EP 0 891 121 A1 and EP 1 029 909 A1.

The HTL in organic EL units contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylaamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl 4,4'-Bis[N-(1-anthryl)N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the LEL in organic EL units includes a luminescent or fluorescent material where electroluminescence is produced as a result of electron-hole pair recombination in this region. The LEL can be comprised of a single material, but more commonly consists of a host material doped with a guest compound or compounds where light emission comes primarily from the dopant and can be of any color. The host materials in the LEL can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly[p-phenylenevinylene], PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-$\mu$-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium(III)]
CO-9: Zirconium oxine [alias, tetra(8-quinolinolato)zirconium(IV)]

Other classes of useful host materials include, but are not limited to, derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Preferred thin film-forming materials for use in forming the ETL in the organic EL units of the present invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

While not always necessary, it is often useful to provide an EIL in the $N^{th}$ organic EL unit to contact the cathode 140. The EIL can serve to facilitate injection of electrons into the ETL and to increase the electrical conductivity resulting in a low driving voltage of the cascaded OLED. Suitable materials for use in the EIL arc the aforementioned ETL with strong reducing agents as dopants or with low work-function metals (<4.0 eV) as dopants described in aforementioned n-type doped organic layer for use in the connecting units. Alternative inorganic electron-injecting materials can also be useful in the organic EL unit which will be described in following paragraph.

When light emission is viewed solely through the anode, the cathode 140 used in the present invention can be comprised of nearly any conductive material. Desirable materials have good film-forming properties to ensure good contact with the underlying organic layer, promote electron injection at low voltage, and have good stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin inorganic EIL in contact with organic layer (e.g., ETL), which is capped with a thicker layer of a conductive metal. Here, the inorganic EIL preferably includes a low work-function metal or metal salt, and if so, the thicker capping layer does not need to have a low work-function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459; 6,278,236; 6,284,393; JP 3,234,963; and EP 1 076 368. Cathode materials are typically deposited by thermal evaporation, electron-bean evaporation, ion sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

In some instances, LEL and ETL in the organic EL units can optionally be collapsed into a single layer that serves the function of supporting both light emission and electron-transportation. It also known in the art that emitting dopants may be added to the HTL, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in U.S. patent application Publication 2002/0025419 A1; U.S. Pat. Nos. 5,683,823; 5,503,910; 5,405,709; 5,283,182; EP 1 187 235; and EP 1 182 244.

Additional layers such as electron or hole-blocking layers as taught in the art may be employed in devices of the present invention. Hole-blocking layers are commonly used to improve efficiency of phosphorescent emitter devices, for example, as in U.S. patent application Publication 2002/0015859 A1.

The organic materials mentioned above are suitably deposited through a vapor-phase method such as thermal evaporation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by thermal evaporation can be vaporized from an evaporation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate evaporation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The entire contents of the patents and other publications referred to in this specification are incorporated herein by reference.

EXAMPLES

The following examples are presented for a further understanding of the present invention. For purposes of brevity, the materials and layers formed therefrom will be abbreviated as given below.

ITO: indium-tin-oxide; used in forming the transparent anode on glass substrates CFx: polymerized fluorocarbon layer; used in forming a hole-injecting layer on top of ITO NPB: N,N'-di(naphthalene-1-yl)-N,N'-diphenyl-benzidine; used in forming the hole-transporting layer in the organic EL unit, and also used as the host in forming the p-type doped organic layer in the connecting unit.

Alq: tris(8-hydroxyquinoline)aluminum(III); used in forming both the electron-transporting layer in the organic EL unit, and also used as host in forming the n-type doped organic layer in the connecting unit.

$F_4$-TCNQ: 2,3,5,6-tetrafluoro-7,7,8,8-tetracyanoquinodimethane; used as p-type dopant in forming the p-type doped organic layer in the connecting unit.

Li: Lithium; used as n-type dopant in forming the n-type doped organic layer in the connecting unit.

Mg:Ag: magnesium:silver at a ratio of 10:0.5 by volume; used in forming the cathode.

The electroluminescence characteristics of all the fabricated devices were evaluated using a constant current source and a photometer at room temperature. The fabricated devices are operated at 20 mA/cm$^2$ and at the room temperature for operational stability test.

Example 1 (Conventional OLED—Comparative)

The preparation of a conventional non-cascaded OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing $CHF_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

(1) a HTL, 75 nm thick, consisting of NPB;
(2) an ETL (also serving as the emissive layer), 60 nm thick, consisting of Alq;
(3) a cathode, approximately 210 nm thick, consisting of Mg:Ag.

After the deposition of these layers, the device was transferred from the deposition chamber into a dry box for encapsulation. The completed device structure is denoted as ITO/CFx/NPB(75)/Alq(60)/Mg:Ag.

Figure 3:
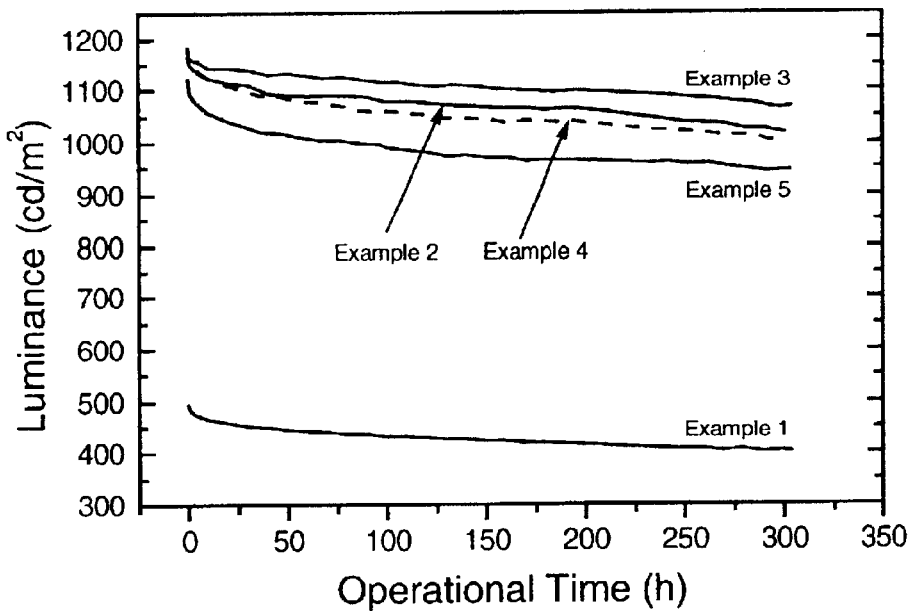
FIG. 3 is a graph of luminance vs. operational time in accordance with the present invention as well as the reference devices under a constant driving current density of 20 mA/cm$^2$ and at the room temperature.
Figure 4:
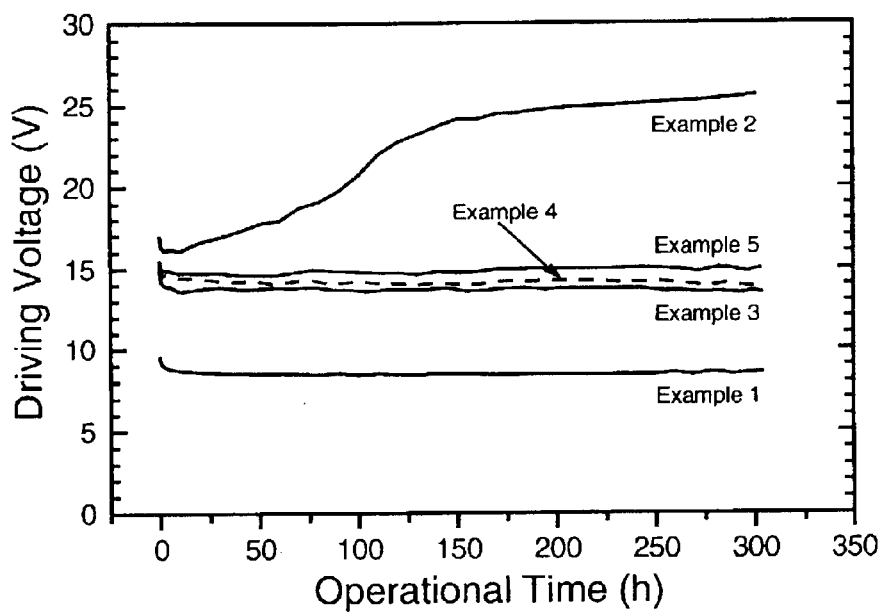
FIG. 4 is a graph of driving voltage vs. operational time of the cascaded OLEDs in accordance with the present invention as well as the reference devices under a constant driving current density of 20 mA/cm$^2$ and at the room temperature.

This device requires a driving voltage of 7.3 V to pass 20 mA/cm². Its luminance is 495 cd/m² and its luminance efficiency is about 2.5 cd/A. The luminance decay vs. operational time is shown in FIG. 3, and the voltage evolution vs. operational time is shown in FIG. 4. After 300 hours' operation, the luminance is dropped by about 20%, but the driving voltage is basically unchanged.

Example 2 (Comparative)

The preparation of a cascaded OLED is as follows: A ~1.1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the HIL by decomposing $CHF_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

(1) a HTL, 90 nm thick, consisting of NPB;
(2) an ETL (also serving as the emissive layer), 30 nm thick, consisting of Alq; [NPB(90 nm)/Alq(30 nm), denoted as EL1, consists of the 1$^{st}$ EL unit];
(3) a n-type doped organic layer, 30 nm thick, consisting of Alq host doped with 1.2 vol. % Li;
(4) a p-type doped organic layer, 60 nm thick, consisting of NPB host doped with 6 vol. % $F_4$-TCNQ [Li doped Alq(30 nm)/$F_4$-TCNQ doped NPB(60 nm) consists of the 1$^{st}$ connecting unit];
(5) a HTL, 30 nm thick, consisting of NPB;
(6) a LEL, 30 nm thick, consisting of Alq;
(7) an ETL 30 nm thick, consisting of Alq host doped with 1.2 vol. % Li; [NPB(30 nm)/Alq(30 nm)/Alq:Li(30 nm), denoted as EL2, consists of the 2$^{nd}$ EL unit;
(8) a cathode, approximately 210 nm thick, consisting of Mg:Ag.

After the deposition of these layers, the device was transferred from the deposition chamber into a dry box for encapsulation. The completed device structure is denoted as ITO/CFx/EL1/Alq:Li(30 nm)/NPB:F4-TCNQ(60 nm)/EL2/Mg:Ag.

This cascaded OLED requires a driving voltage of 14.3 V to pass 20 mA/cm². Its luminance is 1166 cd/m² and its luminance efficiency is about 5.8 cd/A, which are twice as high as those of Example 1. The luminance decay vs. operational time is shown in FIG. 3. After 300 hours' operation, the luminance is dropped by about 15%. The voltage evolution vs. operational time is shown in FIG. 4. It is obvious that the driving voltage is operationally unstable. After 300 hours' operation, the driving voltage is increased by 50%.

Example 3 (Inventive)

A cascaded OLED was fabricated as the same as Example 2 except that a 2-nm-thick PbO was disposed between the Li doped Alq layer and the F4-TCNQ doped NPB layer in the connecting unit.

The cascaded device structure is denoted as ITO/CFx/EL1/Alq:Li(30 nm)/PbO(2 nm)/NPB:$F_4$-TCNQ(60 nm)/EL2/Mg:Ag.

This cascaded OLED requires a driving voltage of 12.6 V to pass 20 mA/cm². Its luminance is 1177 cd/m² and its luminance efficiency is about 5.9 cd/A, which are twice as high as those of Example 1. The luminance decay vs. operational time is shown in FIG. 3. After 300 hours' operation, the luminance dropped by about 10%. The voltage evolution vs. operational time is shown in FIG. 4. The driving voltage is basically unchanged after 300 hours' operation due to the insertion of the 2 nm thick PbO semiconducting interfacial layer in between the n-type doped organic layer and the p-type doped organic layer of the connecting unit.

Example 4 (Inventive)

A cascaded OLED was fabricated as the same as Example 2 except that a 4-nm-thick $Sb_2O_5$ was disposed between the Li doped Alq layer and the F4-TCNQ doped NPB layer in the connecting unit.

The cascaded device structure is denoted as ITO/CFx/EL1/Alq:Li(30 nm)/$Sb_2O_5$(4 nm)/NPB:$F_4$-TCNQ(60 nm)/EL2/Mg:Ag.

This cascaded OLED requires a driving voltage of 13 V to pass 20 mA/cm². Its luminance is 1184 cd/m² and its luminance efficiency is about 5.9 cd/A, which are twice as high as those of Example 1. The luminance decay vs. operational time is shown in FIG. 3. After 300 hours' operation, the luminance dropped by about 15%. The voltage evolution vs. operational time is shown in FIG. 4. The driving voltage is basically unchanged after 300 hours' operation due to the insertion of the 4 nm thick $Sb_2O_5$ semiconducting interfacial layer in between the n-type doped organic layer and the p-type doped organic layer of the connecting unit.

Example 5 (Inventive)

A cascaded OLED was fabricated as the same as Example 2 except that a 0.5-nm-thick Ag was disposed between the Li doped Alq layer and the F4-TCNQ doped NPB layer in the connecting unit.

The cascaded device structure is denoted as ITO/CFx/EL1/Alq: Li(30 nm)/Ag(0.5 nm)/NPB:F4-TCNQ(60 nm)/EL2/Mg:Ag.

This cascaded OLED requires a driving voltage of 12.7 V to pass 20 mA/cm². Its luminance is 1121 cd/m² and its luminance efficiency is about 5.6 cd/A, which are twice as high as those of Example 1. The luminance decay vs. operational time is shown in FIG. 3. After 300 hours' operation, the luminance dropped by about 15%. The voltage evolution vs. operational time is shown in FIG. 4. The driving voltage is basically unchanged after 300 hours' operation due to the insertion of the 0.5 nm thick Ag metallic interfacial layer in between the n-type doped organic layer and the p-type doped organic layer of the connecting unit.

The above examples demonstrate that significant increase in luminance efficiency can be achieved by using a cascaded OLED structure of the present invention comparing the conventional OLED. If operated with the same luminance, significant increase in operational lifetime can also be achieved by using the cascaded OLED structure of the present invention comparing the conventional OLED. Moreover, during operation, the driving voltage can be stabilized due to the insertion of the interfacial layer in the connecting unit. The invention has been described in detail with particular reference to certain preferred embodiments thereof, but it will be understood that variations and modifications can be effected within the spirit and scope of the invention.

PARTS LIST 100 cascaded OLED
110 anode
120 EL unit
120.1 $1^{st}$ EL unit
120.2 $2^{nd}$ EL unit
120.(N−1) $(N-1)^{th}$ EL unit
120.N $N^{th}$ EL unit
130 connecting unit
130.1 $1^{st}$ connecting unit
130.2 $2^{nd}$ connecting unit
130.(N−1) $(N-1)^{th}$ connecting unit
131 n-type doped organic layer
132 interfacial layer
133 p-type doped organic layer
140 cathode
150 voltage/current source
160 electrical conductors

What is claimed is:

1. A cascaded organic electroluminescent device comprising:
   a) an anode;
   b) a cathode;
   c) a plurality of organic electroluminescent units disposed between the anode and the cathode, wherein the organic electroluminescent units comprise at least a hole-transporting layer and an electron-transporting layer; and
   d) a connecting unit disposed between each adjacent organic electroluminescent unit, wherein the connecting unit comprises, in sequence, an n-type doped organic layer, an interfacial layer, and a p-type doped organic layer, and wherein the interfacial layer prevents diffusion or reaction between the n-type doped organic layer and the p-type doped organic layer.

2. The connecting unit of claim 1 wherein the interfacial layer has at least 90% optical transmission in the visible region of the spectrum.

3. The connecting unit of claim 1 wherein the interfacial layer comprises at least one material having an electron energy band gap less than 4.0 eV.

4. The connecting unit of claim 1 wherein the interfacial layer includes the stoichiometric oxides or nonstoichiometric oxides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, and antimony, or combinations thereof.

5. The connecting unit of claim 1 wherein the interfacial layer includes the stoichiometric sulfides or nonstoichiometric sulfides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, and antimony, or combinations thereof.

6. The connecting unit of claim 1 wherein the interfacial layer includes the stoichiometric selenides or nonstoichiometric selenides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, and antimony, or combinations thereof.

7. The connecting unit of claim 1 wherein the interfacial layer includes the stoichiometric nitrides or nonstoichiometric nitrides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, and antimony, or combinations thereof.

8. The connecting unit of claim 1 wherein the interfacial layer includes the stoichiometric carbides or nonstoichiometric carbides of titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, gallium, thallium, silicon, germanium, lead, and antimony, or combinations thereof.

9. The connecting unit of claim 1 wherein the interfacial layer comprises at least one metallic material.

10. The connecting unit of claim 1 wherein the interfacial layer comprises at least one metallic material having a work-function higher than 4.0 eV.

11. The connecting unit of claim 1 wherein the interfacial layer has a thickness in a range of 0.1 nm to 10 nm.

12. The connecting unit of claim 1 wherein the interfacial layer has a thickness in a range of 0.1 nm to 5 nm.

13. The connecting unit of claim 1 where in the interfacial layer is produced by electron-beam evaporation.

14. The connecting unit of claim 1 where in the interfacial layer is produced by electron-beam evaporation.

15. The connecting unit of claim 1 where in the interfacial layer is produced by ion sputtering technique.

* * * * *

UNITED STATES PATENT AND TRADEMARK OFFICE
CERTIFICATE OF CORRECTION

PATENT NO. : 6,717,358 B1
DATED : April 6, 2004
INVENTOR(S) : Liang-Sheng Liao et al.

It is certified that error appears in the above-identified patent and that said Letters Patent is hereby corrected as shown below:

Column 18,
Line 53, claim 13, "The connecting unit of claim 1 where in the interfacial layer is produced by electron-beam evaporation." should read -- The connecting unit of claim 1 wherein the interfacial layer is produced by thermal evaporation. --

Signed and Sealed this

Seventeenth Day of May, 2005

JON W. DUDAS
*Director of the United States Patent and Trademark Office*